United States Patent
Linke et al.

(10) Patent No.: US 10,978,279 B2
(45) Date of Patent: Apr. 13, 2021

(54) TUBULAR TARGET HAVING A PROTECTIVE DEVICE

(75) Inventors: Christian Linke, Waengle (AT); Manfred Sulik, Reutte (AT); Martin Kathrein, Reutte (AT)

(73) Assignee: Plansee SE, Reutte (AT)

( * ) Notice: Subject to any disclaimer, the term of this patent is extended or adjusted under 35 U.S.C. 154(b) by 350 days.

(21) Appl. No.: 14/110,527

(22) PCT Filed: Apr. 5, 2012

(86) PCT No.: PCT/AT2012/000094
§ 371 (c)(1),
(2), (4) Date: Oct. 8, 2013

(87) PCT Pub. No.: WO2012/135883
PCT Pub. Date: Oct. 11, 2012

(65) Prior Publication Data
US 2014/0027276 A1    Jan. 30, 2014

(30) Foreign Application Priority Data

Apr. 8, 2011 (AT) .............. GM203/2011 U

(51) Int. Cl.
*H01J 37/34* (2006.01)
*C23C 14/34* (2006.01)

(52) U.S. Cl.
CPC ........ *H01J 37/342* (2013.01); *C23C 14/3407* (2013.01); *C23C 14/3414* (2013.01); *H01J 37/3426* (2013.01); *H01J 37/3491* (2013.01); *H01J 37/3497* (2013.01)

(58) Field of Classification Search
CPC ............. C23C 14/3407; C23C 14/3414; H01J 37/342; H01J 37/3426; H01J 37/3491; H01J 37/3497; H01J 37/3488
See application file for complete search history.

(56) References Cited

U.S. PATENT DOCUMENTS

| 5,435,965 A | 7/1995 | Mashima et al. |
| 5,665,797 A | 9/1997 | Tahara et al. |
| 6,436,252 B1 | 8/2002 | Tzatzov et al. |

(Continued)

FOREIGN PATENT DOCUMENTS

| AT | 8697 U1 | 11/2006 |
| CN | 1103103 A | 5/1995 |

(Continued)

OTHER PUBLICATIONS

Machine Translation JP02301559A.*

(Continued)

*Primary Examiner* — Michael A Band
(74) *Attorney, Agent, or Firm* — Laurence A. Greenberg; Werner H. Stemer; Ralph E. Locher

(57) ABSTRACT

A tubular target for cathode atomization does not have a backing tube and it is made of molybdenum or a molybdenum alloy. The target has an inner surface which is in contact at least in certain regions with a cooling medium, wherein at least one region of the inner surface is separated from the cooling medium by at least one protective device. By way of example, the protective device may be in the form of a polymer layer. The tubular target exhibits outstanding long-term stability.

8 Claims, 1 Drawing Sheet

(56) References Cited

U.S. PATENT DOCUMENTS

| | | | |
|---|---|---|---|
| 6,787,011 B2 | 9/2004 | Ueda et al. | |
| 7,785,921 B1 | 8/2010 | Juliano et al. | |
| 8,114,794 B2 | 2/2012 | Grynaeus et al. | |
| 9,837,253 B2 | 12/2017 | Rozak et al. | |
| 2003/0136662 A1* | 7/2003 | Ueda et al. | 204/192.1 |
| 2005/0178662 A1* | 8/2005 | Wurczinger | 204/298.21 |
| 2005/0279630 A1* | 12/2005 | Fonte | C23C 14/3414 204/298.21 |
| 2007/0029192 A1 | 2/2007 | Schuhmacher et al. | |
| 2007/0086909 A1 | 4/2007 | Abenthung et al. | |
| 2007/0240981 A1 | 10/2007 | Schlott et al. | |
| 2008/0127887 A1* | 6/2008 | Leung | H01J 37/3402 118/50.1 |
| 2008/0296352 A1 | 12/2008 | Hosokawa et al. | |
| 2011/0014469 A1* | 1/2011 | Nakagawa | C01F 5/02 428/402 |

FOREIGN PATENT DOCUMENTS

| | | |
|---|---|---|
| CN | 1452668 A | 10/2003 |
| CN | 1538545 A | 10/2004 |
| CN | 1992112 A | 7/2007 |
| CN | 101386719 A | 3/2009 |
| CN | 101434818 A | 5/2009 |
| CN | 103154306 A | 6/2013 |
| EP | 0500031 A1 | 8/1992 |
| EP | 1752556 A1 | 2/2007 |
| EP | 1811057 A1 | 7/2007 |
| EP | 1937886 A1 | 7/2008 |
| JP | 02301559 A * | 12/1990 |
| JP | H02301559 A | 12/1990 |
| JP | H0499270 A | 3/1992 |
| JP | H0539566 A | 2/1993 |
| JP | H0817763 A | 1/1996 |
| JP | 2000239839 A | 9/2000 |
| JP | 2004123874 A * | 4/2004 |
| JP | 2005520935 A | 7/2005 |
| JP | 2007302981 A | 11/2007 |
| JP | 2012162759 A | 8/2012 |
| WO | 0177402 A2 | 10/2001 |
| WO | 2007000206 A1 | 1/2007 |
| WO | WO-2007049765 A1 * | 5/2007 .......... H01M 8/0206 |
| WO | 2008150686 A1 | 12/2008 |

OTHER PUBLICATIONS

International Search Report of PCT/AT2012/000094, dated Aug. 6, 2012.

Austrian Patent Office Search Report dated Apr. 8, 2011.

* cited by examiner

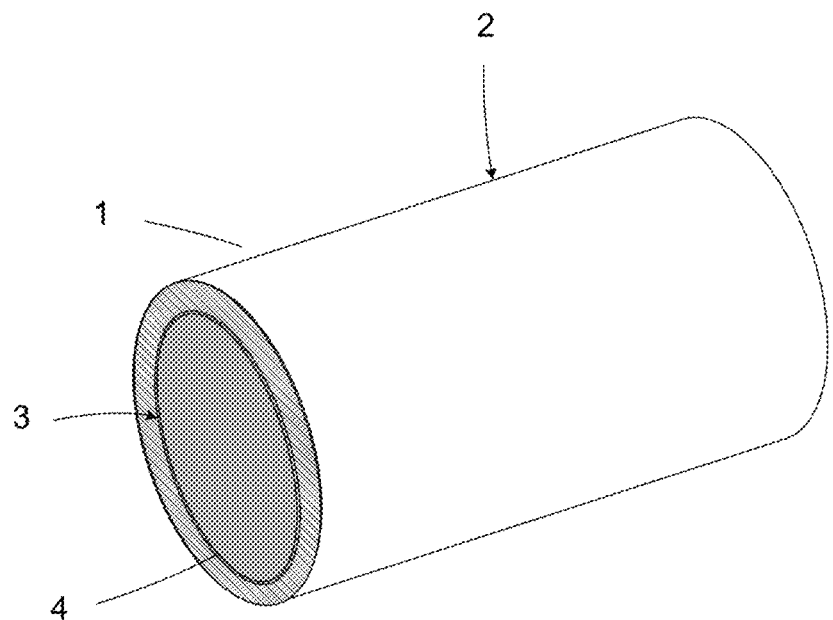

TUBULAR TARGET HAVING A PROTECTIVE DEVICE

BACKGROUND OF THE INVENTION

Field of the Invention

The invention relates to a tubular target for cathode atomization which has no backing tube and is made of molybdenum or a molybdenum alloy with a molybdenum content of at least 50 at. %, having a sputtering surface and an inner surface which is in contact at least in certain regions with a cooling medium.

Tubular targets made of pure molybdenum and molybdenum alloys, for example Mo—Na, are used for the deposition of Mo-containing layers by cathode atomization, for example magnetron sputtering, including during the production of thin-film solar cells based on $Cu(In_x,Ga_{1-x})(Se_y,S_{1-y})_2$ (with Ga:CIGS, without Ga:CIS) or thin-film transistors for TFT-LCD. The Mo-containing layers in this case have thicknesses of a few nm up to a few μm. The starting materials required for sputtering (cathodes) are referred to as sputtering targets and, depending on the design of the coating systems, can be used with a planar or tubular geometry. During operation, tubular sputtering targets, also called tubular targets, are rotated about a stationary or moving magnetic system arranged in the interior of the target. Compared with planar sputtering targets, tubular sputtering targets have the advantage that uniform removal of the material and therefore a higher material yield are achieved. Tubular sputtering targets have gained acceptance particularly for expensive materials with complex production. In the case of ceramics and brittle materials, the tubular target is formed at least in two parts so as not to allow the forces which are required for holding and moving the tubular target to act on the brittle and therefore breakable sputtering material. In this case, a tube or a plurality of tube segments made of the sputtering material are joined to a backing tube, made for example of a non-magnetic steel or titanium. As the joining process, use is made for example of soldering processes using low-melting solders, for example indium or indium alloys.

More than 75% of the energy introduced during sputtering is introduced as heat into the sputtering target. The thermal energy which is produced by the bombardment with high-energy ions on the surface of the sputtering target has to be dissipated in a sufficiently effective manner so as to prevent the sputtering target and/or the soldering material from overheating. The cooling of the sputtering targets is therefore of decisive importance. In the case of tubular targets, the inner surface of the sputtering target is cooled over the entire surface area or in certain regions by a cooling medium which flows through. In this case, depending on the design of the tubular targets, the cooling medium is in direct contact either with the sputtering material or the backing tube.

Tubular targets made of molybdenum or a molybdenum alloy are commonly used with a backing tube. This has the disadvantage not only of the complex joining of sputtering material and backing tube but also of the dissipation of heat which is hindered by the solid backing tube and soldering material. Thus, steels have considerably poorer heat conduction properties than molybdenum.

If, then, a tubular target made of molybdenum or a molybdenum alloy is formed without a backing tube, there is direct contact between the cooling medium and the target material. Molybdenum and molybdenum alloys corrode under the long-lasting action of conventional cooling media. In this case, the corrosion rate is up to a few ¹/₁₀ of a millimeter per year, depending on the composition and nature of the cooling medium and on the conditions of use. The dissolution of the molybdenum caused by the contact with the cooling medium and the corrosion products which form in the process (primarily molybdates or mixed molybdates, e.g. with Cu) lead to a change in the properties of the cooling medium. Thus, for example, the pH value of the cooling medium can be lowered considerably and therefore the further materials which are used in the cooling circuit (such as copper, brass, high-grade steel) can be subjected to an increased corrosive attack. The corrosion of the molybdenum and other materials in the cooling circuit can be reduced, but not completely avoided, by adding inhibitors on an organic or inorganic basis to the coolant. Corrosion inhibitors for molybdenum are described, for example, in U.S. Pat. No. 4,719,035 (A). In addition, it is only possible to regularly check the state of the cooling medium and replenish the additives, if required, with increased system expenditure.

An exemplary overview of the properties of cooling media which are used is given in Table 1.

TABLE 1

| | |
|---|---|
| Cooling medium | Distilled water, softened water, mains water |
| Inlet temperature | Approx. 20° C. |
| Outlet temperature | Approx. 25-40° C. |
| pH value | 7.5-9.5 |
| Electrical conductance | 100-2000 μS/cm |
| Inhibitors | Organic inhibitors, for example thiazoles, triazoles; inorganic inhibitors, for example molybdates |
| Biocides | Organic or inorganic broadband biocides |

It should also be taken into consideration that the commodity price of molybdenum is very high. Used sputtering targets made of molybdenum are normally not recycled, but instead are used in compact form as alloying metal for the production of steels and superalloys. In this respect, scrap of a single type (without admixtures of other metals) obtains considerably higher prices than Mo scrap, which contains elements which are of a different type for conventional steel alloys. Molybdenum tubular targets comprising a backing tube therefore firstly have to be desoldered and the soldering materials, which are conventionally of a different type for steel alloys, have to be removed in a complex manner.

BRIEF SUMMARY OF THE INVENTION

It is therefore an object of the present invention to provide a tubular target which is made of molybdenum or a molybdenum alloy and does not have the disadvantages mentioned in the prior art. In particular, it should be emphasized in this respect that the dissipation of heat has to be ensured to an adequate extent, that corrosion is avoided as far as possible throughout the service life of the tubular target and that used sputtering targets can easily be used as alloying material for the steel industry.

The object is achieved by the characterizing part of the independent claim. The embodiment according to the invention reliably avoids corrosion and does not inadmissibly impair the dissipation of heat. In addition, the used tubular targets can be used as alloying scrap for the production of steel without complex separation or cleaning, since the quantitative proportions of the protective device in terms of the molybdenum proportion are small.

The tubular target consists of pure molybdenum or a molybdenum alloy. In this case, "molybdenum alloys" are understood to mean all Mo-containing materials with an Mo content of greater than 50 at. %. If molybdenum is mentioned hereinbelow, this always encompasses pure molybdenum and Mo-containing materials with an Mo content of greater than 50 at. %. The tubular target is formed with no backing tube. In this case, "with no backing tube" means that no backing tube is used. The molybdenum tubular target is therefore joined directly to the holding system of the sputtering system or to the end block. The outer surface of the tubular target is designated as the sputtering surface. The inner surface corresponds to the inner wall of the tubular target. At least one region of the inner surface is separated from the cooling medium by at least one protective device. There is advantageously areal contact between the target material and the protective device. Furthermore, it is preferable for all of the inner surface which is in contact with the cooling medium to be separated from the cooling medium by at least one protective device. It is advantageous if the protective device has a thickness (measured in the radial direction) of 0.0005 mm to 1 mm. It is particularly advantageous if the protective device has a thickness (measured in the radial direction) of 0.0005 mm to 0.1 mm. If the thermal conductivity of the protective device is less than 1 W/m·K, a thickness of the protective layer of 0.0005 mm to 0.5 mm is preferable. Furthermore, it is advantageous if the protective device is a single-ply or multi-ply layer. In order to improve the layer adhesion, it is advantageous to pretreat, e.g. to degrease or to roughen, the inner surface of the tube before the protective device is applied. Further advantageous embodiments are protective devices in the form of a thin-walled film or of a thin-walled tube which lie seamlessly against the inner surface of the tubular target each under the action of the pressurized coolant. In this case, "thin-walled" is understood in turn to mean thicknesses in the range of up to 1 mm. It is preferable for the protective device to consist at least of one material from the group consisting of polymer, metal, ceramic and glass. An example of a suitable metal is nickel, which can be applied in a simple manner by chemical nickel plating. In the case of ceramic materials, emphasis should be given to Mo nitride, which can be produced in a simple manner by nitriding the Mo tube. Systems based on silicon oxide are suitable in particular for layers of glass.

In addition, materials which have proved to be suitable are those which are noncritical for steel production, for example polymers, the constituents of which (carbon) firstly represent noncritical admixtures in terms of the overall carbon content of the steel, and secondly escape in gas form during steel production (nitrogen, hydrogen, chlorine, fluorine, . . . ). If the protective device consists of ceramic or glass, the constituents are deposited in the slag during steel production.

In view of production costs and recyclability, it is advantageous if the protective device comprises at least one polymer. It is particularly advantageous if the polymer has a thermal conductivity of greater than 0.5 W/m·K, in particular greater than 1 W/m·K. Electrical conductivity also has an advantageous effect on the use properties of the tubular target. Thermal and/or electrical conductivity are achieved, for example, if the polymer is provided with one or more conductive fillers. Suitable fillers which can be mentioned are materials from the group consisting of ceramic, graphite and metal. Particularly suitable fillers are Cu, Al, Si, Zn, Mo, W, oxides, for example $Al_2O_3$, nitrides, for example AlN, TiN, BN, MoN or SiN, carbides, for example SiC, TiC or WC, and graphite.

Furthermore, it is advantageous if the protective device consists of at least one polymer.

Particularly suitable polymers, both in the unfilled and filled state, are polymers from the group consisting of epoxy resin, polyethylene, polypropylene, polyurethane, polyvinyl chloride, polyester, vinyl ester and fluoroelastomer.

The protective device can advantageously be applied or introduced by means of wet coating, painting, spraying or insertion of a film.

Other coating processes are also suitable, however, for example chemical vapour deposition (CVD), thermal spraying, cold spraying, sol-gel coating, plating, cathode atomization (PVD), galvanizing, chemical and electrochemical processes, sintering, diffusion coating, rubbing or backcasting.

The invention is described by way of example hereinbelow.

BRIEF DESCRIPTION OF THE SEVERAL VIEWS OF THE DRAWING

The FIGURE shows an oblique view of the tubular target -1- according to the invention having a sputtering surface -2-, and inner surface -3- and a protective device -4-.

DESCRIPTION OF THE INVENTION

Example 1

A molybdenum tube -1- having an internal diameter of 125 mm, an external diameter of 165 mm and a sputtering surface -2- was produced in accordance with the process described in EP 1 937 866 (A). The inner surface -3- of the molybdenum tube which was to be coated had a length of 1500 mm. The turned inner surface was firstly roughened by sand blasting. The subsequent coating was effected by brushing on an epoxy resin filled with 70% by volume Al having a particle size of 50 μm. The layer thickness of the protective device -4- was approximately 300 μm.

Example 2

Cylindrical molybdenum samples having a diameter of 10 mm and a length of 50 mm were tested for corrosion resistance in the uncoated and coated (Examples 2a to 2g) state in exposure tests. In this case, the samples were stored in various cooling media over a period of time of 160 hours, and the loss in mass of the samples was measured. The coolant bath was agitated by means of a magnetic stirrer during the test period. The results of the measurements are shown in Table 2. The samples designated with R (reference samples) correspond to the prior art (uncoated). Examples 2a to 2g are examples according to the invention.

Example 2a

The turned surface was roughened by sand blasting. The subsequent coating was effected by brushing on an epoxy resin comprising 70% by volume Al having a particle size of 50 μm. The layer thickness was approximately 300 μm.

Example 2b

The turned surface was roughened by sand blasting. The subsequent coating was effected by wet coating with an alkyd resin paint (a polyester), which was dried out in air. The layer thickness was approximately 100 μm.

Example 2c

The turned surface was roughened by sand blasting. The subsequent coating was effected by brushing on an epoxy resin filled with 70% by volume $Al_2O_3$. The layer thickness was approximately 300 μm.

Example 2d

The turned surface was cleaned and degreased by pickling. The subsequent coating was effected by means of the powder spraying of a polyurethane compound. The layer thickness was approximately 500 μm.

Example 2e

The turned surface was cleaned and degreased by pickling. A layer of copper having a thickness of 15 μm was deposited by a conventional electrochemical process (copper sulphate basis).

Example 2f

The turned surface was roughened by sand blasting. An $SiO_2$-based slurry was then applied and heat-treated at 200° C./60 min.

Example 2g

The turned surface was roughened by sand blasting. A TiN layer having a thickness of 2 μm was then applied by means of CVD.

TABLE 2

| Sample | Cooling water | Inhibitor | Corrosion rate [mm/a] | Change in pH value | Mo content in the water [mg] |
|---|---|---|---|---|---|
| R | Mains water | No | 0.9 | 4 | 2300 |
| R | Osmosis water | No | 0.7 | 2 | 1500 |
| R | Mains water | Yes | 0.01 | 0-1 | 20 |
| R | Osmosis water | Yes | 0.2 | 3-4 | 400 |
| Ex. 2a | Mains water | No | <0.0001 | <0.1 | <1 |
| Ex. 2a | Osmosis water | No | <0.0001 | <0.1 | <1 |
| Ex. 2a | Mains water | Yes | <0.0001 | <0.1 | <1 |
| Ex. 2a | Osmosis water | Yes | <0.0001 | <0.1 | <1 |

TABLE 2-continued

| Sample | Cooling water | Inhibitor | Corrosion rate [mm/a] | Change in pH value | Mo content in the water [mg] |
|---|---|---|---|---|---|
| Ex. 2b | Mains water | No | <0.0001 | <0.1 | <1 |
| Ex. 2c | Mains water | No | <0.0001 | <0.1 | <1 |
| Ex. 2d | Mains water | No | <0.0001 | <0.1 | <1 |
| Ex. 2e | Mains water | No | <0.0001 | <0.1 | <1 |
| Ex. 2f | Mains water | No | <0.0001 | <0.1 | <1 |
| Ex. 2g | Mains water | No | <0.0001 | <0.1 | <1 |

The invention claimed is:

1. A tubular target for cathode atomization, comprising:
a tubular target formed without a backing tube and made of molybdenum or a molybdenum alloy having a molybdenum content of at least 50 at. %;
said tubular target having a sputtering surface and an inner surface to be cooled, at least in certain regions thereof, with a cooling medium; and
at least one protective device being a coating layer applied on the inner surface by a coating process, said coating layer being disposed to separate at least one region of the inner surface from the cooling medium and to prevent contact of the cooling medium with the at least one region of the inner surface, and wherein the coating layer comprises at least one polymer, said polymer is provided with a filler and said filler comprises ceramic.

2. The tubular target according to claim 1, wherein said protective device has a surface adjoining and adhering to said inner surface in areal contact with said inner surface.

3. The tubular target according to claim 2, wherein said protective device has a thickness of 0.0005 mm to 1 mm.

4. The tubular target according to claim 3, wherein said protective device has a thickness of 0.0005 mm to 0.1 mm.

5. The tubular target according to claim 1, wherein said protective device is a single-ply or multi-ply layer.

6. The tubular target according to claim 1, wherein an entirety of said inner surface is separated from the cooling medium by at least one protective device.

7. The tubular target according to claim 1, wherein said polymer is a thermally and/or electrically conductive polymer.

8. The tubular target according to claim 1, wherein said polymer is a polymer selected from the group consisting of epoxy resin, polyethylene, polypropylene, polyurethane, polyvinyl chloride, polyester, vinyl ester, and fluoroelastomer.

* * * * *